United States Patent [19]
Hagihara et al.

[11] Patent Number: 6,120,969
[45] Date of Patent: Sep. 19, 2000

[54] POLYPHENOL COMPOUND, QUINONEDIAZIDE ESTER AND POSITIVE PHOTORESIST COMPOSITION

[75] Inventors: Mitsuo Hagihara; Kousuke Doi; Hidekatsu Kohara; Toshimasa Nakayama; Tetsuya Nakajima, all of Kanagawa, Japan

[73] Assignee: Tokyo Ohka Kogyo Co., Ltd., Kanagawa, Japan

[21] Appl. No.: 09/269,881

[22] PCT Filed: Aug. 4, 1998

[86] PCT No.: PCT/JP99/03472

§ 371 Date: Apr. 2, 1999

§ 102(e) Date: Apr. 2, 1999

[30] Foreign Application Priority Data

Aug. 6, 1997 [JP] Japan ................. 9-212103

[51] Int. Cl.⁷ .................................. G03F 7/023
[52] U.S. Cl. ................. 430/191; 430/192; 430/193; 534/557; 568/720
[58] Field of Search ................. 430/191, 192, 430/193; 534/557, 556; 568/720

[56] References Cited

U.S. PATENT DOCUMENTS

| | | |
|---|---|---|
| 5,407,779 | 4/1995 | Uetani et al. ............... 430/192 |
| 5,652,081 | 7/1997 | Tan et al. .................... 430/192 |
| 5,700,620 | 12/1997 | Sakaguchi et al. ........... 430/191 |
| 5,747,218 | 5/1998 | Momota et al. .............. 430/192 |
| 5,750,310 | 5/1998 | Sato et al. ................... 430/192 |
| 5,853,948 | 12/1998 | Sawano et al. .............. 430/166 |
| 5,912,102 | 6/1999 | Kawata et al. ............... 430/191 |

*Primary Examiner*—John S. Chu
*Attorney, Agent, or Firm*—Sughrue, Mion, Zinn, Macpeak & Seas, PLLC

[57] ABSTRACT

Disclosed is, for example, bis(2,5-dimethyl-3-(2-hydroxy-5-ethylbenzyl)-4-hydroxyphenyl)methane and quinonediazide ester thereof. These are used for positive photoresist compositions. According to the invention, positive photoresist compositions having a high definition, a high sensitivity and a large exposure margin can be provided.

5 Claims, 3 Drawing Sheets

POLYPHENOL COMPOUND, QUINONEDIAZIDE ESTER AND POSITIVE PHOTORESIST COMPOSITION

TECHNICAL FIELD

The present invention relates to a novel polyphenol compound, a quinonediazide ester thereof and positive photoresist compositions using the same. It also relates to positive photoresist compositions excellent in sensitivity, definition, exposure margin, focal depth range properties and sectional shape. In particular, the compositions have a large exposure margin and hence are advantageous in the formation of fine patterns of half a micron or narrower.

BACKGROUND ART

Positive photoresist compositions comprising an alkali soluble resin and a quinonediazide ester are excellent in definition, sensitivity and etching resistance and hence have been satisfactorily used for the production of semiconductor devices and liquid crystal devices.

In the current manufacture of ultralarge-scale integrated circuit (ultra LSI), a high definition of not more than half a micron, for example, of 0.4 μm, 0.35 μm or the like is required. In addition, there are demands on photoresist compositions which can form a resist pattern satisfactory in definition, exposure margin, focal depth range properties and having a good sectional shape.

It is, however, difficult to form a resist pattern having an excellent sectional shape in the formation of a fine pattern of half a micron or thinner. With a pattern becoming finer, the rate of change of the pattern shape due to exposure change increases (i.e., the exposure margin is small), and thus, a little difference in exposure conditions invites a large difference in pattern shape. Therefore, the exposure with the use of any of conventional photoresist compositions must be controlled within a very narrow range in order to obtain a good pattern shape of the exact size of a mask pattern.

It is, therefore, an object of the present invention to provide a positive photoresist composition having a high definition, a high sensitivity and a large exposure margin, and to provide a novel polyphenol compound and a quinonediazide ester thereof which can be constituents of the composition.

DISCLOSURE OF INVENTION

After intensive investigations, the present inventors found that the above object can be achieved by using a specific quinonediazide ester as a photosensitizer, or by using a specific polyphenol compound as a sensitizer (sense amplifier). The invention has been accomplished based on the above finding.

To be more specific, the present invention provides a polyphenol compound represented by the following formula (I):

The present invention provides a quinonediazide ester represented by the following formula (II):

(wherein $R^1$, $R^2$, $R^3$ and $R^4$ are independently a hydrogen atom or a naphthoquinone-1,2-diazidesulfonyl group, and wherein at least one is a naphthoquinone-1,2-diazidesulfonyl group).

The present invention also provides the aforementioned quinonediazide ester, in which at least two of $R^1$, $R^2$, $R^3$ and $R^4$ are naphthoquinone-1,2-diazidesulfonyl groups.

The present invention further provides a positive photoresist composition containing (A) an alkali-soluble resin and (B) a photosensitizer, in which the photosensitizer is the aforementioned quinonediazide ester.

Further, the invention provides a positive photoresist composition containing (A) an alkali-soluble resin, (B) a photosensitizer and (C) a sensitizer, in which the sensitizer is the aforementioned polyphenol compound.

Incidentally, photoresist compositions respectively using any of photosensitizers specifically described in Japanese Patent Laid-Open Nos. 6-167805, 7-159990, 7-219220 and 8-339079 or a photosensitizer described in Japanese Patent Laid-Open No. 8-245461 are insufficient in the improvement of exposure margin.

BEST MODE FOR CARRYING OUT THE INVENTION

Polyphenol Compound

As a synthetic process for producing the polyphenol compound represented by the formula (I) of the invention, there may be mentioned a process of reacting bis(2,5-dimethyl-3-methylol-4-hydroxyphenyl)methane represented by the following formula (III) with 4-ethylphenol:

The compound represented by the formula (III) can be obtained synthetically according to, for example, the methods disclosed in Japanese Patent Laid-Open Nos. 6-167805 and 8-245461. By way of illustration, it can be obtained by reacting 2,5-xylenol with formaldehyde in the presence of an alkali catalyst.

The reaction between the compound represented by the formula (III) and 4-ethylphenol may be carried out using 4-ethylphenol in an amount ranging from 5 to 50 moles, preferably from 8 to 30 moles and more preferably from 10 to 25 moles, per mole of the compound represented by the formula (III). This reaction may be conducted in the presence of an acid catalyst. As examples of acid catalysts, there may be mentioned hydrochloric acid, sulfuric acid and other inorganic acids and formic acid, acetic acid, p-toluenesulfonic acid and other organic acids, among which p-toluenesulfonic acid can advantageously be used.

The amount of the acid catalyst is equal to or less than 1 equivalent and preferably in the range from 0.1 to 0.5 equivalent per mole of the compound represented by the formula (III).

The reaction may be carried out in a solvent. Examples of such reaction solvents include methanol, ethanol, propanol, butanol, ethylene glycol, propylene glycol and other alcohols, diethylene glycol dimethyl ether, propylene glycol monopropyl ether, 1,2-dimethoxyethane, 1,2-diethoxyethane and other ethers, tetrahydrofuran, dioxane and other cyclic ethers, acetone, methyl ethyl ketone, methyl isobutyl ketone and other ketones, γ-butyrolactone and other cyclic esters, benzene, toluene, xylene and other aromatic compounds. These solvents can be used in combination. In particular, γ-butyrolactone or mixtures of γ-butyrolactone and any of other solvents are preferred.

The reaction may be conducted in the following manner: The compound represented by the formula (III) is dissolved in any of the above reaction solvents at a final concentration of 1 to 50% by weight to give a solution (Solution A), whereas 4-ethylphenol is heated and molten to give a solution (Solution B). To Solution B is added the acid catalyst, and the resultant mixture is heated to a temperature ranging from 30° C. to 100° C. and preferably from 70° C. to 100° C. with stirring. To this heated mixture is gradually added dropwise Solution A over approximately 1 to 3 hours. After the completion of the addition, the resultant mixture is stirred for 1 to 6 hours, while maintaining the mixture at the aforementioned temperature.

After the completion of the reaction, the solvent is distilled off to thereby give crystals of the polyphenol compound represented by the formula (I). The crystals can be precipitated by adding a reaction solution in an aromatic solvent, condensing the resultant mixture to a certain extent, and cooling the condensate. When an aromatic solvent is used as the reaction solvent, crystals of the compound of the formula (I) are to be separated in the reaction solvent. Accordingly, the crystals can be obtained by cooling the reaction mixture to room temperature and subsequently filtering it. The obtained crystals may be purified by recrystallization.

Quinonediazide Ester

The quinonediazide ester of the invention which is represented by the formula (II) can be obtained by esterifying the polyphenol compound of the formula (I) with a naphthoquinone-1,2-diazidesulfonyl halide (NQD). Examples of preferred NQDs include naphthoquinone-1,2-diazide-4-sulfonyl chloride (4-NQD), naphthoquinone-1,2-diazide-5-sulfonyl chloride (5-NQD), naphthoquinone-1,2-diazide-6-sulfonyl chloride (6-NQD) and the like.

In general, the degree of esterification depends on the charging proportion of NQD with respect to a polyphenol compound. The compound represented by the formula (II), however, is characterized in that it can be obtained as a diester comprising 2 moles of added NQD at a high yield.

Positive Photoresist Composition

The positive photoresist composition of the invention contains (A) an alkali-soluble resin and (B) a photosensitizer, and is characterized by using the quinonediazide ester represented by the formula (II) as the photosensitizer (B), and/or using the polyphenol compound represented by the formula (I) as a sensitizer (C).

Individual ingredients will be now described below.

(A) Alkali-Soluble Resin

The alkali-soluble resin, Ingredient (A), is not restricted and can arbitrarily be selected from those generally used as film-forming substances in positive photosensitive compositions. Condensates of aromatic hydroxy compounds and aldehydes or ketones, polyhydroxystyrenes and their derivatives can be preferably used as the resin.

The aromatic hydroxy compounds include, for example, phenol, m-cresol, p-cresol, o-cresol, 2,3-xylenol, 2,5-xylenol, 3,5-xylenol, 3,4-xylenol and other xylenols; m-ethylphenol, p-ethylphenol, o-ethylphenol, 2,3,5-trimethylphenol, 2,3,5-triethylphenol, 4-tert-butylphenol, 3-tert-butylphenol, 2-tert-butylphenol, 2-tert-butyl-4-methylphenol, 2-tert-butyl-5-methylphenol and other alkyl-substituted phenols; p-methoxyphenol, m-methoxyphenol, p-ethoxyphenol, m-ethoxyphenol, p-propoxyphenol, m-propoxyphenol and other alkoxy-substituted phenols; o-isopropenylphenol, p-isopropenylphenol, 2-methyl-4-isopropenylphenol, 2-ethyl-4-isopropenylphenol and other isopropenyl-substituted phenols; phenylphenol and other aryl-substituted phenols; 4,4'-dihydroxybiphenyl, bisphenol A, resorcinol, hydroquinone, pyrogallol and other polyhydroxyphenols. Each of these resins can be used independently or in combination.

As examples of the aldehydes, there may be mentioned formaldehyde, paraformaldehyde, trioxane, acetaldehyde, propionaldehyde, butyraldehyde, trimethylacetaldehyde, acrolein, crotonaldehyde, cyclohexanaldehyde, furfural, furylacrolein, benzaldehyde, terephthalaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, o-methylbenzaldehyde, m-methylbenzaldehyde, p-methylbenzaldehyde, o-chlorobenzaldehyde, m-chlorobenzaldehyde, p-chlorobenzaldehyde, cinnamaldehyde and the like. Each of these aldehydes may be used independently or in combination.

Examples of the ketones include acetone, methyl ethyl ketone, diethyl ketone and diphenyl ketone. Each of these ketones may be used singly or in combination. Further, a suitable combination of any of aldehydes and any of ketones can be employed.

The condensate of an aromatic hydroxy compound and an aldehyde or a ketone can be prepared in the presence of an acidic catalyst according to a known technique. Such an acidic catalyst includes, for instance, hydrochloric acid, sulfuric acid, formic acid, oxalic acid, p-toluenesulfonic acid and the like.

As examples of the polyhydroxystyrenes and their derivatives, there may be mentioned vinylphenol homopolymers, copolymers of vinylphenol and a copolymerizable comonomer therewith. Such a comonomer includes acrylic acid derivatives, acrylonitrile, methacrylic acid derivatives, methacrylonitrile, styrene, α-methylstyrene, p-methylstyrene, o-methylstyrene, p-methoxystyrene, p-chlorostyrene and other styrene derivatives.

Of these alkali-soluble resins used in the present invention as Ingredient (A), novolak resins obtained by condensation of an aromatic hydroxy compound and an aldehyde are advantageously used. The weight average molecular weight of the novolak resin may range from 2,000 to 25,000, preferably from 2,500 to 20,000 and more preferably from 3,000 to 15,000, while the resin may comprise no low molecular weight fraction. The term "weight average molecular weight" as used herein is defined as the value in terms of polystyrene measured by gel permeation chromatography (GPC).

Particularly preferred are novolak resins containing m-cresol, p-cresol and 2,5-xylenol as constitutive units, having a weight average molecular weight (Mw) of 5,000 to 10,000, a p-cresol content of 5 to 40% by mole, and an ortho-ortho bonding content of 20 to 80% by mole. The term "ortho-ortho bonding" used herein means a methylene bond connecting two phenolic compounds in the o-position relative to the hydroxy groups of both phenolic compounds.

The removal of low molecular weight fractions can be conducted by fractionation or other treatments. The fractionation is carried out by, for example, a process of dissolving a resin obtained by condensation in a good solvent and adding the resultant solution into water to thereby form precipitates. The good solvent includes, for instance, methanol, ethanol and other alcohols, acetone, methyl ethyl ketone and other ketones, ethylene glycol monoethyl ether acetate, and tetrahydrofuran.

(B) Photosensitizer

There are following three embodiments of the positive photoresist composition according to the invention, namely, the positive photoresist composition of the invention:

(i) where the photosensitizer (B) is specified to the quinonediazide ester of the formula (II), whereas the sensitizer (C) is not particularly specified;

(ii) where the photosensitizer (B) is not particularly specified, whereas the sensitizer (C) is specified to the polyphenol compound of the formula (I); and (iii) where the photosensitizer (B) is specified to the quinonediazide ester of the formula (II) and the sensitizer (C) is specified to the polyphenol compound of the formula (I). When the quinonediazide ester of the formula (II) is used as the photosensitizer (B), the sensitizer (C) may not be incorporated.

The term "specify" used herein does not mean that Ingredient (B) or Ingredient (C) may be one single component but that at least one specific Ingredient (B) or Ingredient (C) may only be included in the composition, and that other components in addition to the specific component can be incorporated in the composition. Each of the embodiments will be described below.

(i) Embodiment where photosensitizer (B) is specified to the quinonediazide compound of the formula (II) and the sensitizer (C) is not particularly specified In this embodiment, at least the quinonediazide compound of the formula (II) is used as the photosensitizer, Ingredient (B). The sensitizer (C) can be either used or not. When it is used, examples of the sensitizer (C), in addition to the polyphenol compound of the formula (I), include 2,4-bis[1-(4-hydroxyphenyl)isopropyl]-5-hydroxyphenol, bis(4-hydroxy-2,3,5-trimethylphenyl)-2-hydroxyphenylmethane, 2,4-bis(3,5-dimethyl-4-hydroxyphenylmethyl)-6-methylphenol, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, 1-[1-(4-hydroxyphenyl)isopropyl]-4-[1,1-bis(4-hydroxyphenyl)ethyl]benzene, 1-[1-(3-methyl-4-hydroxyphenyl)isopropyl]-4-[1,1-bis(3-methyl-4-hydroxyphenyl)ethyl]benzene, 2,6-bis[1-(2,4-dihydroxyphenyl)isopropyl]-4-methylphenol, 4,6-bis[1-(4-hydroxyphenyl)isopropyl]resorcin, 4,6-bis(3,5-dimethoxy-4-hydroxyphenylmethyl)pyrogallol, 4,6-bis(3,5-dimethyl-4-hydroxyphenylmethyl)pyrogallol, 2,6-bis(3-methyl-4,6-dihydroxyphenylmethyl)-4-methylphenol, 2,6-bis(2,3,4-trihydroxyphenylmethyl)-4-methylphenol and 1,1-bis(4-hydroxyphenyl)cyclohexane. Among them, typically preferred are 2,4-bis[1-(4-hydroxyphenyl)isopropyl]-5-hydroxyphenol, bis(4-hydroxy-2,3,5-trimethylphenyl)-2-hydroxyphenylmethane, bis(4-hydroxy-3,5-dimethylphenyl)-3,4-dihydroxyphenylmethane and 2,4-bis(3,5-dimethyl-4-hydroxyphenylmethyl)-6-methylphenol.

(ii) Embodiment where the photosensitizer (B) is not particularly specified and the sensitizer (C) is specified to the polyphenol compound of the formula (I)

In this embodiment, at least the polyphenol compound of the formula (I) is used as Ingredient (C). The photosensitizer (B) in this embodiment includes esters obtained from a phenol compound and a naphthoquinone-1,2-diazidesulfonyl halide. As the polyphenol compounds, there may be mentioned for example 2,4-bis[2-hydroxy-3-(4-hydroxybenzyl)-5-methylbenzyl]-6-cyclohexylphenol, 2,4-bis[4-hydroxy-3-(4-hydroxybenzyl)-5-methylbenzyl]-6-cyclohexylphenol and other polynuclear compounds; 2,3,4-trihydroxybenzophenone, 2,4,4'-trihydroxybenzophenone, 2,4,6-trihydroxybenzophenone, 2,3,4,4'-tetrahydroxybenzophenone, 2,2',4,4'-tetrahydroxybenzophenone, 2,3',4,4',6-pentahydroxybenzophenone, 2,2',3,4,4'-pentahydroxybenzophenone, 2,2',3,4,5'-pentahydroxybenzophenone, 2,3',4,5,5'-pentahydroxybenzophenone, 2,3,3',4,4',5'-hexahydroxybenzophenone and other polyhydroxybenzophenones; bis[2-hydroxy-3-(2-hydroxy-5-methylbenzyl)-5-methylphenyl]methane, tris(4-hydroxyphenyl)methane, bis(4-hydroxy-3,5-dimethyphenyl)-4-hydroxyphenylmethane, bis(4-hydroxy-3,5-dimethylphenyl)-3-hydroxyphenylmethane, bis(4-hydroxy-3,5-dimethylphenyl)-2-hydroxyphenylmethane, bis(4-hydroxy-2,5-dimethylphenyl)-4-hydroxyphenylmethane, bis(4-hydroxy-2,5-dimethylphenyl)-3-hydroxyphenylmethane, bis(4-hydroxy-2,5-diethylphenyl)-2-hydroxyphenylmethane, bis(4-hydroxy-3,5-dimethylphenyl)-3,4-dihydroxyphenylmethane, bis(4-hydroxy-2,5-dimethyphenyl)-3,4-dihydroxyphenylmethane, bis(4-hydroxy-3,5-dimethylphenyl)-2,4-dihydroxyphenylmethane, bis(4-hydroxy-2,5-dimethylphenyl)-2,4-dihydroxyphenylmethane, bis(4-hydroxyphenyl)-3-methoxy-4-hydroxyphenylmethane, bis(3-cyclohexyl-4-hydroxyphenyl)-3-hydroxyphenylmethane, bis(3-cyclohexyl-4-hydroxyphenyl)-2-hydroxyphenylmethane, bis(3-cyclohexyl-4-hydroxyphenyl)-4-hydroxyphenylmethane, bis(3-cyclohexyl-4-hydroxy-6-methylphenyl)-2-hydroxyphenylmethane, bis(3-cyclohexyl-4-hydroxy-6-methylphenyl)-3-hydroxyphenylmethane, bis(3-cyclohexyl-4-hydroxy-6-methylphenyl)-4-hydroxyphenylmethane, bis(3-cyclohexyl-4-hydroxy-6-methylphenyl)-3,4-dihydroxyphenylmethane, bis(3-cyclohexyl-6-hydroxyphenyl)-3-hydroxyphenylmethane, bis(3-cyclohexyl-6-hydroxyphenyl)-4-hydroxyphenylmethane, bis(3-cyclohexyl-6-hydroxyphenyl)-2-hydroxyphenylmethane, bis(3-cyclohexyl-6-hydroxy-4-methylphenyl)-2-hydroxyphenylmethane, bis(4-hydroxy-2-methyl-5-cyclohexylphenyl)-3,4-dihydroxyphenylmethane, bis(3-cyclohexyl-6-hydroxy-4-methylphenyl)-4-hydroxyphenylmethane, bis(3-cyclohexyl-6-hydroxy-4-methylphenyl)-3,4-dihydroxyphenylmethane, 1-[1-(4-hydroxyphenyl)isopropyl]-4-[1,1-bis(4-hydroxyphenyl)ethyl]benzene, 1-[1-(3-methyl-4-hydroxyphenyl)isopropyl]-4-[1,1-bis(3-methyl-4-hydroxyphenyl)ethyl]benzene, bis(4-hydroxy-2,3,5-trimethylphenyl)-2-hydroxyphenylmethane, bis(4-hydroxy-2,3,5-trimethylphenyl)-3-hydroxyphenylmethane , bis(4-hydroxy-2,3,5-trimethylphenyl)-4-hydroxyphenylmethane, bis(4-hydroxy-2,3,5-trimethylphenyl)-3,4-dihydroxyphenylmethane, bis(4-hydroxy-2,3,5-trimethylphenyl)-4-hydroxy-3-methoxyphenylmethane and other hydroxy-substituted aryl compounds; 2-(2,3,4-trihydroxyphenyl)-2-(2',3',4'-trihydroxyphenyl)propane, 2-(2,4-dihydroxyphenyl)-2-(2',4'-dihydroxyphenyl)propane, 2-(4-hydroxyphenyl)-2-(4'-hydroxyphenyl)propane, bis(2,3,4-trihydroxyphenyl)methane, bis(2,4-dihydroxyphenyl)methane and other bis(hydroxyphenyl)alkane compounds; 1,1-bis(4-hydroxyphenyl)cyclohexane, 1,1-bis(2-methyl-4-hydroxyphenyl)cyclohexane and other bis(hydroxyphenyl)cycloalkane compounds; phenol, p-methoxyphenol, dimethylphenol, hydroquinone, bisphenol A, naphthol, pyrocatechol, pyrogallol monomethyl ether, pyrogallol-1,3-dimethyl ether, gallic acid, partially-esterified or partially-etherified gallic acid derivatives and other phenols.

(iii) Embodiment where the photosensitizer (B) is specified to the quinonediazide ester of the formula (II) and the sensitizer (C) is specified to the polyphenol compound of the formula (I)

In this embodiment, at least the compound of the quinonediazide ester of the formula (II) is used as the photosensitizer, Ingredient (B), and at least the polyphenol compound of the formula (I) is used as Ingredient (C). Any of other photosensitizers and sensitizers as mentioned above can be used in addition to the above ingredients where necessary.

The proportions of the individual ingredients in the positive photoresist composition of the invention will be illustrated in detail below.

The proportion of the photosensitizer (B) may advantageously fall in the range from 10 to 60% by weight and preferably from 20 to 50% by weight relative to the total weight of the alkali-soluble resin (A) and the sensitizer (C), in any of the above embodiments (i) to (iii). The incorporation of Ingredient (B) within the aforementioned range improves definition and sensitivity.

The proportion of the sensitizer (C) may advantageously fall in the range from 5 to 50% by weight and preferably from 10 to 35% by weight relative to the alkali-soluble resin (A), in any of the above embodiments (i) to (iii).

The positive photoresist composition of the invention can be incorporated with at least one sulfonyl halide represented by the following formula (IV) as Ingredient (D):

$$R^5-SO_2-X \quad (IV)$$

(wherein $R^5$ is an alkyl group, a substituted alkyl group, an alkenyl group, an aryl group or a substituted aryl group, and X is F or Cl)

As examples of the sulfonyl halide represented by the general formula (IV), there may be mentioned methanesulfonyl chloride, methanesulfonyl fluoride, ethanesulfonyl chloride, n-propanesulfonyl chloride, n-butanesulfonyl chloride, pentanesulfonyl chloride, dodecanesulfonyl chloride and other alkane sulfonyl halides each having from 1 to 12 carbon atoms; chloromethylsulfonyl chloride, dichloromethylsulfonyl chloride, trichloromethylsulfonyl chloride, 2-chloroethylsulfonyl chloride and other substituted alkane sulfonyl halides each having from 1 to 12 carbon atoms; ethylenesulfonyl chloride, 1-propene-1-sulfonyl chloride and other alkene sulfonyl halides each having 2 or 3 carbon atoms; benzenesulfonyl chloride, benzenesulfonyl fluoride, benzylsulfonyl chloride, 1-naphthalenesulfonyl chloride and other aryl sulfonyl halides; p-toluenesulfonyl chloride, p-ethylbenzenesulfonyl chloride, p-styrenesulfonyl chloride, p-methoxybenzenesulfonyl chloride and other alkyl-, alkenyl- or alkoxy-substituted aryl sulfonyl halides. Among these compounds, alkane sulfonyl halides, aryl sulfonyl halides and alkyl-substituted aryl sulfonyl halides are preferred, of which p-toluenesulfonyl chloride (PTSC) is typically preferred.

The addition of Ingredient (D) enhances the film residual ratio and provides a rectangular resist pattern rather than a tapered resist pattern. In particular, it can prevent the resist pattern from reducing its thickness due to the focal depth shifts to the plus site.

The proportion of Ingredient (D) can fall in the range from 0.01 to 5% by weight and preferably from 0.1 to 1% by weight relative to the total solid content of the positive photoresist composition. When the proportion of Ingredient (D) is less than the above range, the advantages of the addition of this ingredient cannot exhibit sufficiently. On the contrary, when it exceeds the range, a resultant resist pattern shows a phenomenon of "constriction" in its bottom portion and hence results in a deteriorated shape.

In addition, the positive photoresist composition of the invention may comprise, as Ingredient (E), a compound represented by the following formula (V):

(V)

(wherein each of $R^6$ and $R^7$ is, either identical or different, a hydrogen atom, a substituted or non-substituted alkyl group, alkenyl group or alkoxy group each having from 1 to 6 carbon atoms.)

As practical examples of the alkyl group having 1 to 6 carbon atoms in the definitions of $R^6$ and $R^7$ in the formula (V), there may be mentioned methyl group, ethyl group, propyl group, n-butyl group, isobutyl group, sec-butyl group, t-butyl group, pentyl group, hexyl group and others. The alkenyl group having 2 to 6 carbon atoms include, for example, vinyl group and allyl group. Practical examples of the alkoxy group having from 1 to 6 carbon atoms include methoxy group, ethoxy group, propoxy group, isopropoxy group, n-butoxy group, isobutoxy group, sec-butoxy group, t-butoxy group, pentyloxy group, hexyloxy group and so on.

As concrete example of Ingredient E, there may be mentioned 1,4-bis[1- (3-cyclohexyl-4-hydroxy-6-methylphenyl)isopropyl]benzene (BCIB), and this compound is particularly preferred.

The addition of Ingredient (E) as above enhances the film residual rate, and further improves the exposure margin.

The proportion of Ingredient (E) may advantageously fall in the range from 0.01 to 10% by weight and preferably from 1 to 5% by weight relative to the total solid content of the positive photoresist composition. When it is below this range, the advantages of the addition of this ingredient cannot sufficiently exert. On the contrary, when it exceeds the range, it results in a deteriorated shape of the resultant pattern.

In addition to the above specified ingredients, where necessary, the composition of the present invention may further comprise any of compatible additives including, for example, ultraviolet absorbents for inhibition of halation and surfactants for prevention of striation within ranges not adversely affecting the objects of the invention. Examples of the ultraviolet absorbents include 4,4'-diethylaminobenzophenone, 2,2',4,4'-tetrahydroxybenzophenone, 4-dimethylamino-2'4'-dihydroxybenzophenone, 5-amino-3-methyl-1-phenyl-4-(4-hydroxyphenylazo)pyrazole, 4 -dimethylamino-4'-hydroxyazobenzene, 4-diethylamino-4'-ethoxyazobenzene, 4-diethylaminoazobenzene and curcumin. As the surfactants, there may be mentioned, for instance, Fluorade FC-430 and FC-431 (trade names, manufactured by Sumitomo 3M Ltd., Japan), F-TOP EF 122A, EF 122B, EF 122C and EF 126 (trade names, manufactured by Tochem Products Ltd., Japan) and other fluorine-containing surfactants.

The positive photoresist composition of the present invention may preferably used as a solution obtained by dissolving each of Ingredients (A) to (C) and various additional ingredients in a proper solvent.

Practical examples of the solvent include acetone, methyl ethyl ketone, cyclohexanone, methyl isoamyl ketone, 2-heptanone and other ketones; ethylene glycol, propylene glycol, diethylene glycol, ethylene glycol monoacetate, propylene glycol monoacetate, diethylene glycol monoacetate, or their monomethyl ethers, monoethyl ethers, monopropyl ethers, monobutyl ethers or monophenyl ethers and other polyhydric alcohols and their derivatives; dioxane and other cyclic ethers; and ethyl lactate, methyl acetate, ethyl acetate, butyl acetate, methyl pyruvate, ethyl pyruvate, methyl methoxypropionate, ethyl ethoxypropionate and other esters. Each of these compounds may be used solely or in combination.

Practically, the composition of the invention may be used, for example, in the following manner: Each of the ingredients (A) to (C) and other ingredients added according to necessity including Ingredients (D) and (E) is dissolved in a proper solvent as mentioned above to give a coating solution; the coating solution is then applied, using a spinner or the like, onto a silicon wafer or a substrate on which an anti-reflection coating has been formed, and subsequently dried to form a photosensitive film; next, the photosensitive film is irradiated and exposed with an ultraviolet ray source such as a low-pressure mercury lamp, a high-pressure mercury lamp, an ultra-high-pressure mercury lamp, an arc lamp or a xenon lamp, through a desired mask pattern, or irradiated with a scanning electron beam; and the exposed portions of the film are then dissolved and removed by dipping in a developer solution, for example, an alkaline aqueous solution such as a 1 to 10% by weight tetramethylammonium hydroxide (TMAH) aqueous solution, thus forming an image being in exact accordance with the mask pattern.

EXAMPLES

The present invention will be further illustrated in detail with reference to several inventive examples and comparative examples below.

Each of the physical properties of positive photoresist compositions was evaluated according to the following methods, respectively.

(1) Exposure Margin

A sample was applied onto a silicon wafer using a spinner, and dried on a hot plate at 90° C. for 90 sec. to form a resist film having a thickness of 0.85 μm. The resist film was then irradiated for an increasing period from 0.1 sec. at intervals of 0.01 sec. using a reducing-type projection aligner NSR-2005i10D (manufactured by Nikon Corporation, Japan; NA=0.57). The film was then subjected to PEB (post-exposure baking) at 110° C. for 90 sec.; subjected to development in a 2.38% by weight tetramethylammonium hydroxide aqueous solution at 23° C. for 60 sec., washed with water for 30 sec., and dried. In this procedure, the exposure margin was defined as Eop/Eth (ms), where the minimum exposure time period to give an exposed portion having a thickness of zero after development was defined as Eth (ms), and the exposure time period to obtain a 0.35 μm line and space with a ratio of 1:1 was defined as Eop (ms).

(2) Sensitivity

A sample was applied onto a silicon wafer using a spinner, and dried on a hot plate at 90° C. for 90 sec. to form a resist film having a thickness of 0.85 μm. The resist film was then irradiated for an increasing period from 0.1 sec. at intervals of 0.01 sec. using a reducing-type projection aligner NSR-2005i10D (manufactured by Nikon Corporation, Japan; NA=0.57). The film was then subjected to PEB (post-exposure baking) at 110° C. for 90 sec.; subjected to development in a 2.38% by weight tetramethylammonium hydroxide aqueous solution at 23° C. for 60 sec., washed with water for 30 sec., and dried. In this procedure, the minimum exposure time period to give an exposed portion having a thickness of zero after development was defined as the sensitivity indicated in millisecond (ms).

(3) Definition

The definition was defined as the critical definition at an exposure which reproduced a 0.35 μm mask pattern.

(4) Focal Depth Range Properties

A sample was subjected to exposure and development using a reducing-type projection aligner NSR-2005i10D (manufactured by Nikon Corporation, Japan; NA=0.57) at an exposure of Eop (the exposure time period to form a 0.35 μm line-and-space width 1:1) as a standard exposure, where the focus was shifted up and down at this exposure. The obtained isolated resist pattern was subjected to an SEM photographic observation. Based upon the SEM photograph, the focal depth range was defined as the maximum value (μm) of the focal shift (defocus) to obtain a 0.35 μm rectangular resist pattern.

(5) Sectional Shape (5-1) Plus Site of Focus

An isolated resist pattern having a thickness of 0.85 μm and a width of 0.35 μm was subjected to an SEM (scanning electron microscopy) photographic observation of the sectional shape. The sectional shape of the pattern when the focus shifted 0.6 μm to the plus site was evaluated according to the following criteria: A: the film reduced its thickness less than 10%; B: the film reduced its thickness in the range from 10% to 50%; and C: the film reduced its thickness more than 50%.

(5-2) Minus Site of Focus

An isolated resist pattern having a thickness of 0.85 μm and a width of 0.35 μm was subjected to an SEM (scanning electron microscopy) photographic observation of the sectional shape. The sectional shape of the pattern when the focus shifted 0.4 μm to the minus site was evaluated according to the following criteria: A: almost rectangular, and no pattern diminishment observed; B: reverse-tapering shape or pattern diminishment observed; C: twist of pattern formed

SYNTHETIC EXAMPLE 1

Preparation of the Compound Represented by the Formula (I) [bis(2,5-dimethyl-3-(2-hydroxy-5-ethylbenzyl)-4-hydroxyphenyl)methane]

Figure 1:
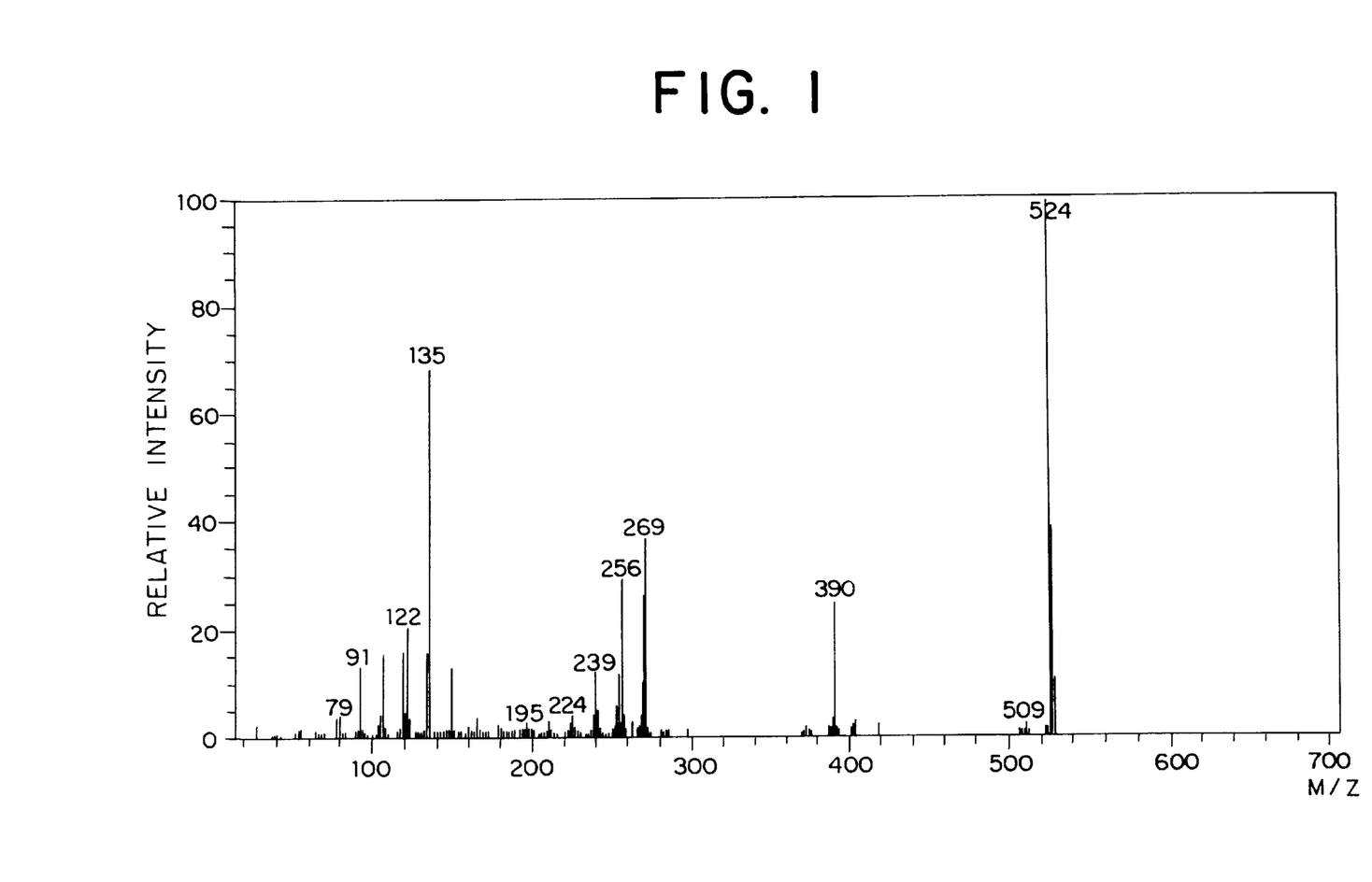
FIG. 1 is a diagram illustrating the results of mass spectrometry of crystals of bis(2,5-dimethyl-3-(2-hydroxy-5-ethylbenzyl)-4-hydroxyphenyl)methane prepared in Synthetic Example 1.
Figure 2:
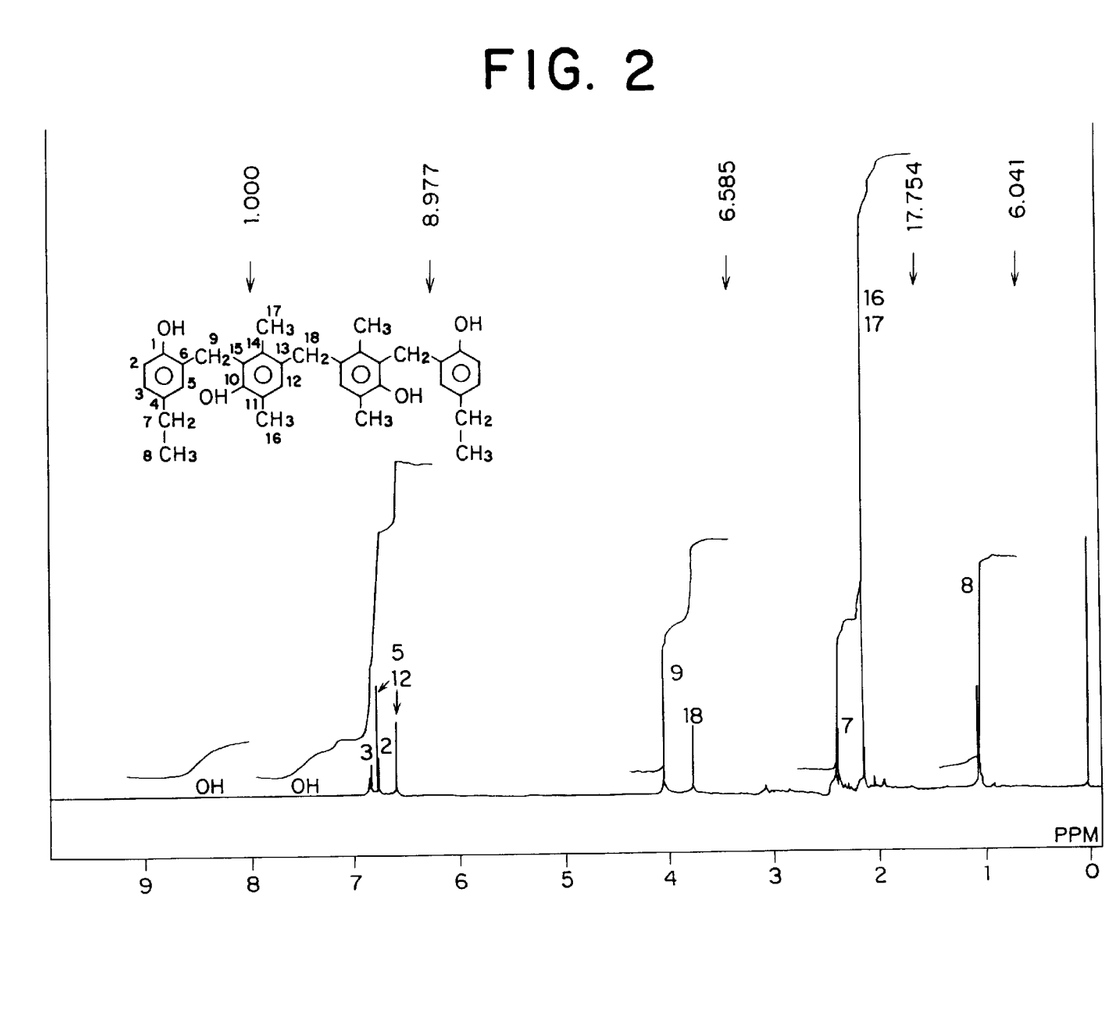
FIG. 2 is a diagram illustrating the results of $^1$H-NMR analysis of crystals of bis(2,5-dimethyl-3-(2-hydroxy-5-ethylbenzyl)-4-hydroxyphenyl)methane prepared in Synthetic Example 1.
Figure 3:
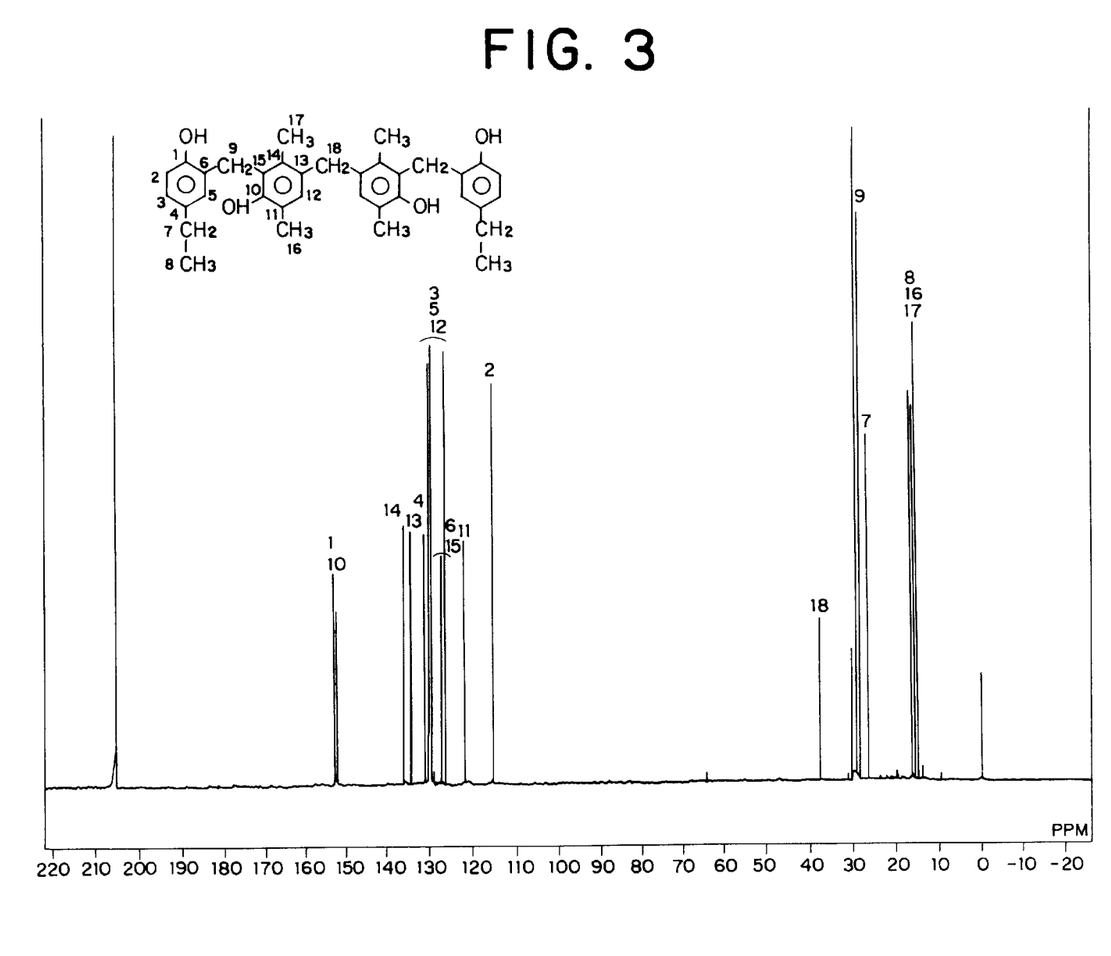
FIG. 3 is a diagram illustrating the results of $^{13}$C-NMR analysis of crystals of bis(2,5-dimethyl-3-(2-hydroxy-5-ethylbenzyl)-4-hydroxyphenyl)methane prepared in Synthetic Example 1.

In a mixture solvent of γ-butyrolactone and methanol (3:4) was dissolved 30 g (0.1 mole) of the compound represented by the formula (III) [bis(2,5-dimethyl-3-methylol-4-hydroxyphenyl)methane] to give a 4.1% by weight solution (Solution A). Separately, Solution B was prepared by heating and melting 231.6 g (1.9 moles) of 4-ethylphenol. To Solution B was added 5 g of p-toluenesulfonic acid as an acid catalyst, and the mixture was heated to 90° C. with stirring. Solution A was added dropwise to this heated mixture over 1 hour, and after the completion of addition, the resultant mixture was stirred for 5 hours while maintaining the aforementioned temperature. The reaction solution was then put into a large excess of toluene with stirring. In this procedure, n-heptane can be used instead of toluene. The resultant mixture was then concentrated on an evaporator, and the condensate was allowed to stand in a cold room for 1 day, and thereby crystals were precipitated. The crystals were isolated by filtration and the obtained crystals were washed with toluene and dried for 1 day under reduced pressure to give 10 g of a crystallized substance. The substance was subjected to GPC analysis, mass spectrometry, $^1$H-NMR analysis and $^{13}$C-NMR analysis, and found to be bis(2,5-dimethyl-3-(2-hydroxy-5-ethylbenzyl)-4-hydroxyphenyl)methane (a1) at a purity of 95%. The results of mass spectrometry, $^1$H-NMR analysis and $^{13}$C-NMR analysis are respectively illustrated in FIGS. 1, 2 and 3. The mass spectrometry was conducted according to the EI method (electron impact method) directly as in the ionized method using JMS DX-303 (manufactured by JEOL Ltd.). Separately, a sample was dissolved in heavy acetone and the solution was respectively subjected to $^1$H-NMR analysis and $^{13}$C-NMR analysis using JNM-GX 400 (manufactured by JEOL Ltd.). If the purity is below 90%, the substrate can be further purified by recrystallization. As the solvent for recrystallization, butyl acetate is preferred, and precipitated crystals are preferably washed with toluene. The crystals can also be washed with n-heptane instead of toluene.

SYNTHETIC EXAMPLE 2

Preparation of the Quinonediazide Ester (Diester) Represented by the Formula (II)

A 1-liter four-neck flask was charged with 30 g (0.06 mole) of the compound represented by the formula (I) prepared in Synthetic Example 1, 30.7 g (0.11 mole) of 5-NQD and 184 g of dioxane, and the charge was dissolved completely. To the resultant solution was added dropwise 23.2 g of triethylamine at 20 to 30° C. over 1 hour. After the completion of addition, the mixture was stirred at 30° C. for 3 hours. A total of 10 g acetic acid was added to the mixture and the mixture was further stirred for 1 hour while maintaining the aforementioned temperature; the reaction mixture was filtered, and the obtained solid matter was washed with 200 g of dioxane. The filtrate and washing were poured into a mixture of 5 g of acetic acid and 400 g of ion-exchange water, the resultant mixture was stirred for 1 hour, and the precipitated crystals were separated by filtration. The obtained crystals were put into 500 g of ion-exchange water, stirred and washed. This washing procedure was repeated further three times. The resultant was filtered to give crystals, and the obtained crystal was dried at 40° C. to give 60 g of the compound represented by the formula (II) (B1).

The obtained substance was subjected to GPC analysis and reversed phase chromatography (ester column), and it was found that its diester was produced at a yield of 90%.

EXAMPLE 1

A positive photoresist composition was prepared in the following manner: In 470 parts by weight of 2-heptanone were dissolved 100 parts by weight of an alkali-soluble novolak resin (weight average molecular weight (Mw)=4,000, ortho-ortho bonding content of 21%), 30 parts by weight of 2,4-bis[1-(4-hydroxyphenyl)isopropyl]-5-hydroxyphenol (C-1) as a sensitizer, and 50 parts by weight of the diester (B1) prepared in Synthetic Example 2. The mixture was filtered with a membrane filter having a pore size of 0.2 μm to give a positive photoresist composition. The above alkali-soluble resin was comprised of m-cresol:p-cresol:2,5-xylenol=4:4:2 (mole ratio) and comprised of no low molecular weight fraction.

EXAMPLE 2

A positive photoresist composition was prepared in a similar manner to Example 1, except that a resin comprised of m-cresol:p-cresol:2,5-xylenol=5:1:4 (Mw=7,700, ortho-ortho bonding content 53%) was used as the alkali-soluble novolak resin.

EXAMPLE 3

The procedure of Example 2 was repeated to give a positive photoresist composition, except that 0.3 part by weight of PTSC was further added to the composition of Example 2.

EXAMPLE 4

A positive photoresist composition was prepared in a similar manner to Example 3, except that 3 parts by weight of BCIB was further added to the composition of Example 3.

EXAMPLE 5

The procedure of Example 4 was repeated to give a positive photoresist composition, except that the compound C-1 was substituted with the compound a1 prepared in Synthetic Example 1.

COMPARATIVE EXAMPLE 1

A positive photoresist composition was prepared in a similar manner to Example 4, except that the compound B1 was substituted with a diester of a compound B2 represented by the following formula:

(B2)

COMPARATIVE EXAMPLE 2

A positive photoresist composition was prepared in a similar manner to Example 4, except that a diester of a compound B3 represented by the following formula was used instead of the compound B1 in Example 4:

(B3)

COMPARATIVE EXAMPLE 3

The procedure of Example 4 was repeated to give a positive photoresist composition, except that a triester of a compound B4 represented by the following formula was employed instead of the compound B1:

(B4)

Each of the positive photoresist compositions prepared in Examples 1 to 5 and Comparative Examples 1 to 3 was subjected to analysis and evaluation of the aforementioned physical properties (1) to (5). The results are set forth in Table 1.

TABLE 1

| | Ingredient (A) (m-/p-/2,5-ratio)* (Mw) (o—o content %)** | Ingredient (B) | Ingredient (C) | Additive | Exposure margin | Sensitivity (ms) | Definition | Focus Depth Range Property (μm) | Sectional shape Focus + site | Focus − site |
|---|---|---|---|---|---|---|---|---|---|---|
| Example | | | | | | | | | | |
| 1 | (4/4/2) (4000) (21) | B1 | C-1 | — | 2.2 | 270 | 0.30 | 0.8 | C | A |
| 2 | (5/1/4) (7700) (53) | B1 | C-1 | — | 2.2 | 270 | 0.28 | 1.0 | C | A |
| 3 | (5/1/4) (7700) (53) | B1 | C-1 | PTSC | 2.2 | 270 | 0.28 | 1.2 | B | A |
| 4 | (5/1/4) (7700) (53) | B1 | C-1 | PTSC BCIB | 2.3 | 290 | 0.28 | 1.4 | A | A |
| 5 | (5/1/4) (7700) (53) | B1 | a1 | PTSC BCIB | 2.5 | 300 | 0.28 | 1.4 | A | A |
| Comp. Ex. | | | | | | | | | | |
| 1 | (5/1/4) (7700) (53) | B2 | C-1 | PTSC BCIB | 2.0 | 250 | 0.28 | 1.4 | B | B |
| 2 | (5/1/4) (7700) (53) | B3 | C-1 | PTSC BCIB | 2.0 | 270 | 0.30 | 1.4 | B | B |
| 3 | (5/1/4) (7700) (53) | B4 | C-1 | PTSC BCIB | 2.0 | 200 | 0.30 | 1.2 | B | C |

Note:
*The term "m-/p-2,5-" means "m-cresol/p-cresol/2,5-xylenol".
**The term "o—o content %" means the content (%) of ortho-ortho bonding.

TABLE 1-2

| Comp. Ex. | Ingredient (A) (m-/p-/2,5-ratio)* (Mw) (o—o content %)** | Ingredient (B) | Ingredient (C) | Additive | Exposure margin | Sensitivity (ms) | Definition | Focus Depth Range Property (μm) | Sectional shape Focus + site | Sectional shape Focus − site |
|---|---|---|---|---|---|---|---|---|---|---|
| 1 | (5/1/4) (7700) (53) | B2 | C-1 | PTSC BCIB | 2.0 | 250 | 0.28 | 1.4 | B | B |
| 2 | (5/1/4) (7700) (53) | B3 | C-1 | PTSC BCIB | 2.0 | 270 | 0.30 | 1.4 | B | B |
| 3 | (5/1/4) (7700) (53) | B4 | C-1 | PTSC BCIB | 2.0 | 200 | 0.30 | 1.2 | B | C |

Note:
*The term "m-/p-2,5-" means "m-cresol/p-cresol/2,5-xylenol".
**The term "o—o content %" means the content (%) of ortho-ortho bonding.

INDUSTRIAL APPLICABILITY

According to the present invention, positive photoresist compositions having a high definition, a high sensitivity and a large exposure margin can be provided.

What is claimed is:

1. A polyphenol compound represented by the following formula (I):

2. A quinonediazide ester represented by the following formula (II):

wherein $R^1$, $R^2$, $R^3$ and $R^4$ are independently a hydrogen atom or a naphthoquinone-1,2-diazidesulfonyl group and wherein at least one is a naphthoquinone-1,2-diazidesulfonyl group.

3. The quinonediazide ester according to claim 2, wherein at least two of $R^1$, $R^2$, $R^3$ and $R^4$ are naphthoquinone-1,2-diazidesulfonyl groups.

4. A positive photoresist composition comprising (A) an alkali-soluble resin and (B) a photosensitizer, wherein said photosensitizer is the quinonediazide ester as claimed in claim 2.

5. A positive photoresist composition comprising (A) an alkali-soluble resin, (B) a photosensitizer and (C) a sensitizer, wherein said sensitizer is the polyphenol compound as claimed in claim 1.

* * * * *